United States Patent
Linebarger, Jr. et al.

(10) Patent No.: US 12,272,591 B2
(45) Date of Patent: Apr. 8, 2025

(54) FRICTION STIR WELDING IN SEMICONDUCTOR MANUFACTURING APPLICATIONS

(71) Applicant: Lam Research Corporation, Fremont, CA (US)

(72) Inventors: Nick Ray Linebarger, Jr., Beaverton, OR (US); Prahalad Narasinghdas Agarwal, Bangalore (IN); Ravikumar Sadashiv Patil, Bengaluru (IN); Damodar Rajaram Shanbhag, Tualatin, OR (US)

(73) Assignee: Lam Research Corporation, Fremont, CA (US)

(*) Notice: Subject to any disclaimer, the term of this patent is extended or adjusted under 35 U.S.C. 154(b) by 826 days.

(21) Appl. No.: 17/438,932

(22) PCT Filed: Mar. 12, 2020

(86) PCT No.: PCT/US2020/022497
§ 371 (c)(1),
(2) Date: Sep. 13, 2021

(87) PCT Pub. No.: WO2020/190658
PCT Pub. Date: Sep. 24, 2020

(65) Prior Publication Data
US 2022/0189817 A1    Jun. 16, 2022

Related U.S. Application Data

(60) Provisional application No. 62/819,215, filed on Mar. 15, 2019.

(51) Int. Cl.
*H01L 21/687* (2006.01)
*B23K 20/12* (2006.01)
(Continued)

(52) U.S. Cl.
CPC .... *H01L 21/68785* (2013.01); *B23K 20/1255* (2013.01); *B23K 20/129* (2013.01);
(Continued)

(58) Field of Classification Search
CPC ............. H01J 37/3244; H01J 37/32449; H01J 37/32513; H01J 37/32522;
(Continued)

(56) References Cited

U.S. PATENT DOCUMENTS 6,329,304 B1 * 12/2001 Kuznetsov ........ H01L 21/67784
118/724
9,881,788 B2    1/2018 Kim et al.
(Continued)

FOREIGN PATENT DOCUMENTS

CN        1952211 A    4/2007
JP    H08115886 A    5/1996
(Continued)

OTHER PUBLICATIONS

International Application Serial No. PCT/US2020/022497, International Search Report mailed Jul. 2, 2020, 4 pgs.
(Continued)

*Primary Examiner* — Hung D Nguyen
(74) *Attorney, Agent, or Firm* — Weaver Austin Villeneuve & Sampson LLP

(57) ABSTRACT

In an example, a showerhead pedestal assembly for a substrate processing chamber is provided. The showerhead pedestal assembly includes a faceplate. A platen is disposed within the faceplate and includes a heater element extending through at least one groove in the faceplate. The at least one groove is profiled to accept at least one portion of the heater element. A periphery of the platen is joined to an interior surface of the faceplate by a friction stir welded joint.

34 Claims, 11 Drawing Sheets

(51) Int. Cl.
*H01L 21/67* (2006.01)
*B23K 101/40* (2006.01)

(52) U.S. Cl.
CPC .. *H01L 21/67103* (2013.01); *H01L 21/68757* (2013.01); *B23K 2101/40* (2018.08)

(58) Field of Classification Search
CPC ........... H01J 37/32633; H01J 37/32807; H01J 37/32901; H01J 2237/006; H01J 2237/20; H01J 2237/2065; H01J 2237/327; H01J 2237/3321; H01J 2237/334; H01L 21/67103; H01L 21/67109; H01L 21/6719; H01L 21/67248; H01L 21/67784; H01L 21/6838; H01L 21/68735; H01L 21/68742; H01L 21/6875; H01L 21/68757; H01L 21/68785; H01L 21/68792; C23C 16/45502; C23C 16/45504; C23C 16/45508; C23C 16/45519; C23C 16/45536; C23C 16/45544; C23C 16/45565; C23C 16/45574; C23C 16/45578; C23C 16/4558; C23C 16/45589; C23C 16/45591; C23C 16/45597; B23K 20/1205; B23K 20/122; B23K 20/1255; B23K 20/127; B23K 20/129; B23K 2101/40; H05B 3/16; H05B 3/18; H05B 2203/021

See application file for complete search history.

(56) References Cited

U.S. PATENT DOCUMENTS

| | | | |
|---|---|---|---|
| 10,851,457 | B2 | 12/2020 | Shaikh et al. |
| 2007/0090516 | A1 | 4/2007 | White |
| 2007/0169703 | A1 | 7/2007 | Elliot et al. |
| 2008/0053614 | A1 | 3/2008 | Sago et al. |
| 2012/0161405 | A1* | 6/2012 | Mohn ............... H01L 21/67109 279/142 |
| 2012/0222815 | A1 | 9/2012 | Sabri et al. |
| 2013/0284721 | A1 | 10/2013 | Yang et al. |
| 2017/0009344 | A1 | 1/2017 | Meinhold et al. |
| 2017/0196047 | A1* | 7/2017 | Polyak ..................... H05B 3/18 |
| 2017/0301515 | A1 | 10/2017 | Madsen et al. |
| 2018/0057940 | A1 | 3/2018 | Madsen et al. |

FOREIGN PATENT DOCUMENTS

| | | |
|---|---|---|
| JP | H10326788 A | 12/1998 |
| JP | H11302853 A | 11/1999 |
| JP | 2002270347 A | 9/2002 |
| JP | 2006108527 A | 4/2006 |
| JP | 2007169777 A | 7/2007 |
| JP | 2013194278 A | 9/2013 |
| JP | 2014509783 A | 4/2014 |
| JP | 2017199898 A | 11/2017 |
| JP | 2018059183 A | 4/2018 |
| KR | 20040074001 A | 8/2004 |
| KR | 20060069251 A | 6/2006 |
| KR | 20090056536 A | 6/2009 |
| KR | 20100137795 A | 12/2010 |
| KR | 20110083832 A | 7/2011 |
| KR | 20130026193 A | 3/2013 |
| KR | 20150013637 A | 2/2015 |
| KR | 20150022485 A | 3/2015 |
| KR | 20170117333 A | 10/2017 |
| KR | 20200038317 A | 4/2020 |
| TW | 200826198 A | 6/2008 |
| WO | WO-2019046134 A1 | 3/2019 |

OTHER PUBLICATIONS

International Application Serial No. PCT/US2020/022497, Written Opinion mailed Jul. 2, 2020, 6 pgs.
CN Office Action dated May 23, 2024 in CN Application No. 202080021384.9 with English translation.
International Preliminary Report on Patentability dated Sep. 30, 2021, in PCT Application No. PCT/US2020/022497.
JP Office Action dated Apr. 2, 2024 in JP Application No. 2021-555428, with English Translation.
KR Office Action dated Aug. 28, 2023, in Application No. KR10-2021-7033051 with English translation.
KR Office Action dated Feb. 25, 2023, in Application No. KR10-2021-7033051 with English translation.
SG Written Opinion dated Jul. 3, 2023 in Application No. SG11202110075R.

* cited by examiner

FRICTION STIR WELDING IN SEMICONDUCTOR MANUFACTURING APPLICATIONS

CLAIM OF PRIORITY

This application is a U.S. National Stage Filing under 35 U.S.C. 371 from International Application No. PCT/US2020/022497, filed on Mar. 12, 2020, and published as WO 2020/190658 A1 on Sep. 24, 2020, which claims the benefit of priority to U.S. Patent Application Ser. No. 62/819,215, filed on Mar. 15, 2019, each of which is incorporated by reference herein in its entirety.

FIELD

The present disclosure relates generally to friction stir welding in semiconductor manufacturing applications, and more particularly to forming friction stir welded components that enable efficient heat transfer during the manufacture of semiconductor devices. In an example particular aspect, the disclosure relates to the use of friction stir welding in joining components together in a pedestal, more particularly a showerhead pedestal, for a processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In some conventional semiconductor manufacturing applications, heater coils are embedded into a pedestal platen channel and filled with a metal plug that is e-beam (electron beam) welded or vacuum brazed into place. In such instances, interfacial joint strength between heater coils and pedestal parts have proven to be inconsistent and poor, resulting in non-effective heat transfer between heater coils and the pedestal plates and sometimes causing pedestal warping and premature failure of a pedestal.

SUMMARY

In some embodiments, friction stir welding of heater coils is used to address limitations of conventional welding techniques and to seek to avoid pedestal warping and premature failure thereof. Improved thermal performance of the pedestal is also sought to be provided in some embodiments through the use of thermal posts or columns and cascaded circular baffles.

In some examples, a showerhead pedestal assembly for a substrate processing chamber is provided. An example showerhead pedestal assembly includes a faceplate; a platen disposed within the faceplate, the platen including a heater element extending through at least one groove in the faceplate, the at least one groove profiled to accept at least one portion of the heater element extending therethrough; a power supply for the heater element; wherein a periphery of the platen is joined to an interior surface of the faceplate by a friction stir welded joint.

In some examples, the faceplate includes a plurality of apertures to allow the passage of a gas through the showerhead pedestal assembly to an underside of a substrate supported by the showerhead pedestal assembly.

In some examples, the showerhead pedestal assembly further comprises a plurality of heat transfer posts extending between opposed surfaces of the faceplate and the platen, the plurality of heat transfer posts including a friction stir welded material.

In some examples, the friction stir welded material is dissimilar to a material of the faceplate or the platen and enables the creation of a friction stir welded joint between the faceplate and the platen.

In some examples, a material of the plurality of heat transfer posts is selected to enhance or retard heat transfer between the faceplate and the platen.

In some examples, a material of the plurality of heat transfer posts is the same as a material of the heater element.

In some examples, the showerhead pedestal assembly further comprises a filler cap including at least one baffle sized and configured to reside in the at least one groove in the faceplate.

In some examples, the at least one baffle of the filler cap secures the at least one portion of the heater element in a respective groove in the faceplate.

In some examples, the at least one baffle includes a curved formation, the curved formation matching a profile of the respective groove in the faceplate.

In some examples, the at least one baffle includes a friction stir welded material.

In some examples, the at least one baffle is provided along an upper surface of the filler cap.

In some examples, a portion of the filler cap includes a heat sink, the heat sink providing a body of relatively cooler material than a material of the platen during operation of the showerhead pedestal assembly.

In some examples, the at least one baffle includes at least one aperture allowing the passage of gas therethrough.

In some examples, the at least one baffle is provided in a series of baffles extending in a spaced array along a profile of the heater element, the spaced array of baffles including one or more gaps between sequential baffles allowing the passage of gas therethrough.

In some examples, the friction stir welded material of the at least one baffle is dissimilar to a material of the faceplate or the heater element and enables the creation of a friction stir welded joint between the heater element and the faceplate.

In some examples, the at least one baffle is included in a plurality of concentric rings of baffles.

In some examples, at least one ring of the plurality of concentric rings of baffles includes spaced baffles.

In some examples, each of the spaced baffles includes one or more apertures form therein allowing a specific or controlled flow of gas through the one or more apertures.

In some examples, a gap between a pair of spaced baffles in the at least one concentric ring of baffles is sized to allow a specific or controlled flow of gas to pass therethrough.

In some examples, the heater element is energized by the power supply during formation of the friction stir welded joint.

DESCRIPTION OF THE DRAWINGS

Some embodiments are illustrated by way of example and not limitation in the views of the accompanying drawings.

DESCRIPTION

Figure 1:
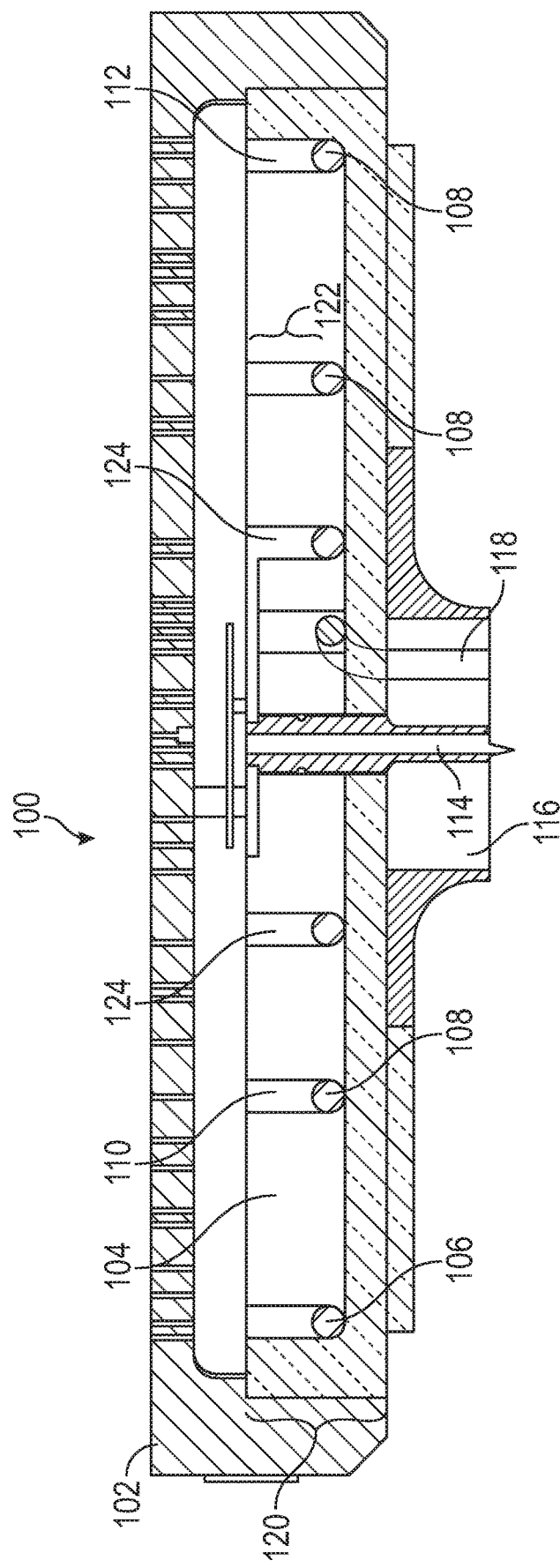
FIG. 1 is a sectional view of a showerhead pedestal, according to an example embodiment.

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below, and in the drawings, that form a part of this document: copyright Lam Research Corporation. 2019-2020, all rights reserved.

Many semiconductor manufacturing applications include the use of a substrate processing chamber. A processing chamber may include a pedestal or truck to secure a substrate (such as a wafer) during processing. As mentioned above, heater coils used in such pedestals are usually manufactured by conventional techniques such as vacuum brazing or electron beam welding. Interfacial joint strength between heater coils and pedestal parts have proven to be inconsistent and poor, resulting in non-effective heat transfer between heater and the pedestal plates and sometimes causing pedestal warping and premature failure of a pedestal.

In some present examples, friction stir welding (FSW) is employed to manufacture or join pedestal parts such as a heater element, a faceplate, and a pedestal stem, for example. The manufacture or joining of other components is possible. The methods and articles of manufacture described herein may exhibit improved thermal and mechanical properties as compared to articles made using conventional techniques such as vacuum brazing and electron beam welding. FSW addresses several limitations of conventional techniques. Such limitations may include weld cracking and porosity resulting in a reduced heat transfer within pedestal components and a diminished efficiency of a processing chamber to which such a pedestal has been fitted.

With reference to FIG. 1, an example showerhead pedestal assembly 100 includes a faceplate 102 and a platen 104 disposed within the faceplate 102. In some examples, the faceplate 102 includes apertures as shown to allow the passage of gases up through the showerhead pedestal assembly 100 to an underside of a substrate (such as a wafer) supported by the showerhead pedestal assembly 100 in use.

The platen 104 distributes heat within the showerhead pedestal assembly 100. The platen 104 includes a heater element 106. The profile and general configuration of an example heater element 106 may be more clearly reviewed pictorially as shown in example 300 of FIG. 3 or in FIG. 7. The heater element 106 includes a number of heater coils 108 lying in a common plane within channels (recesses, or grooves) 124 formed in the platen 104, as shown. Other coil arrangements are possible. A heater coil 108 is secured within a groove by filler cap 110 material. The grooves may be continuous and shaped to accept a profile and configuration of a given heater element 106. The material of a filler cap 110 may, or may not, include the same material as a material of the platen 104, or a material of a heater coil 108. A material of a filler cap 110 may be selected to improve or boost the transfer of heat through the platen 104 to the faceplate 102 or other regions of the showerhead pedestal assembly 100. A deep or increased weld depth enabled in some examples by friction stir welding in a channel 124 allows for the introduction of a heat sink. The heat sink provides a body of relatively cooler material than the platen 104, and this cooler mass may assist in preventing platen 104 warping. A relative thermal conductivity of a filler cap 110 material in a channel 124 may also be selected to assist in this regard.

Power to the heater coils 108 of the heater element 106 may be supplied by a power line 118. A gas distribution channel 114 distributes gas to the apertured faceplate 102 and other components of the showerhead pedestal assembly 100. The power line 118 and gas distribution channel 114 may pass through a stem 116 of the showerhead pedestal assembly 100, as shown.

In some examples, friction stir welding is used to assemble or form components of the showerhead pedestal assembly 100. For example, in zone 120 (FIG. 1), a friction stir weld is employed to join the periphery of the platen 104 to an interior surface of the faceplate 102. In a further example, in zone 122 (FIG. 1), a friction stir weld is employed to form a filler cap 110 above a heater coil 108 to secure the heater coil 108 in the body of the platen 104, as shown. Other pedestal components may be joined or formed in similar manner. Other friction stir welding zones are possible.

Figure 2:
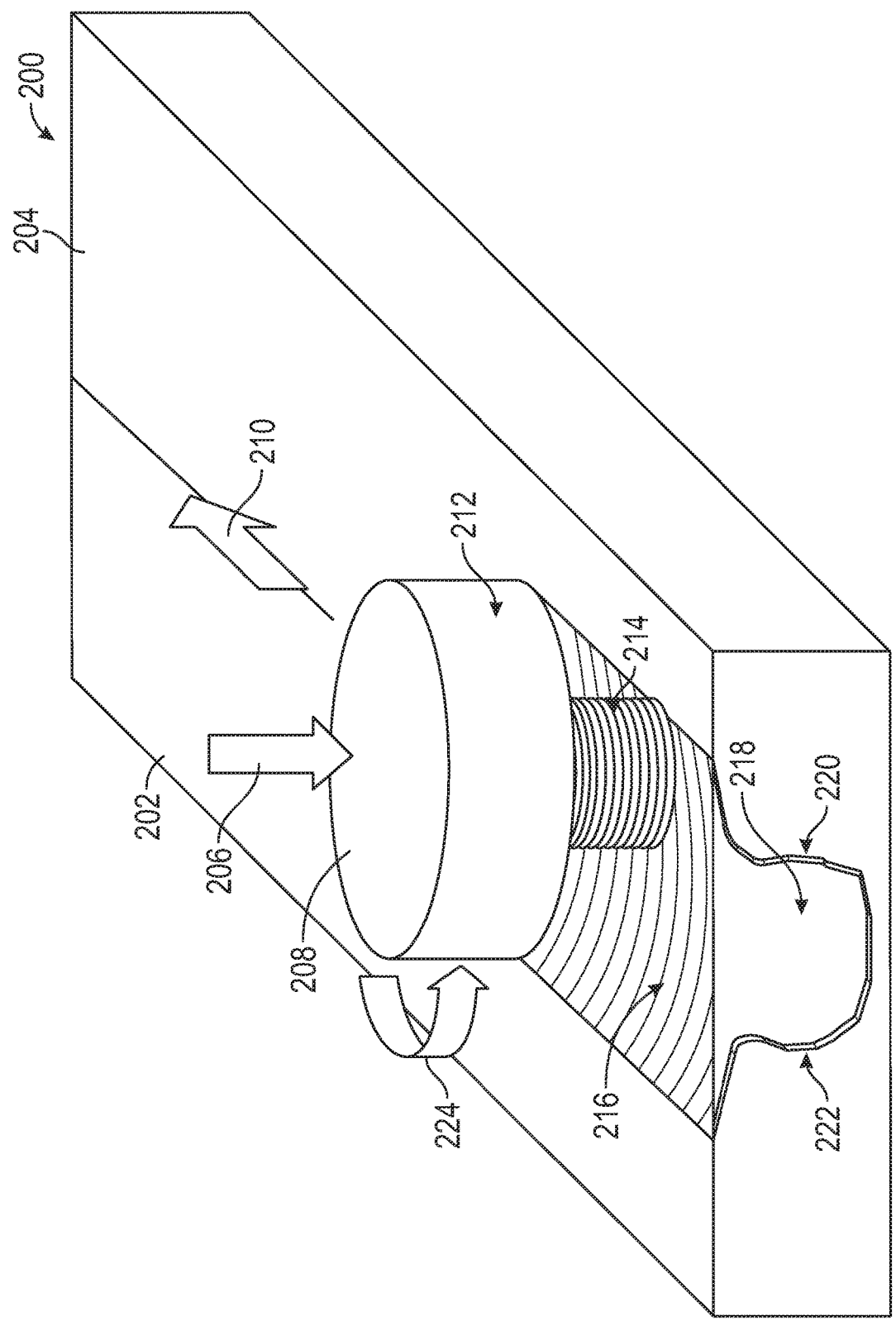
FIG. 2 depicts an arrangement for friction stir welding, according to an example embodiment.

With reference to FIG. 2, an arrangement 200 for friction stir welding is provided. One component 202 of the showerhead pedestal assembly 100 may be joined to another component 204 in the manner shown. The illustrated component 202 may include an edge portion of a faceplate 102, disposed for example in zone 120. The other illustrated component 204 may include an edge portion of a platen 104, for example disposed in the same zone 120. As shown, a downward three 206 is exerted on a rotating friction stir welding (FSW) tool 208 that is advanced in a weld direction 210 between the edge portions of the two components 202 and 204. The FSW tool 208 includes a shoulder 212 and a pin 214. The spinning FSW tool 208 creates a friction stir welded region 216 as it advances though the material of the components 202 and 204 to be joined together. The friction stir welded region 216 so formed includes a welded nugget 218 that joins the components 202 and 204 together. The nugget 218 has an advancing side 220 and a retreating side 222 corresponding to the spinning rotational direction 224 of the tool.

Figure 3:
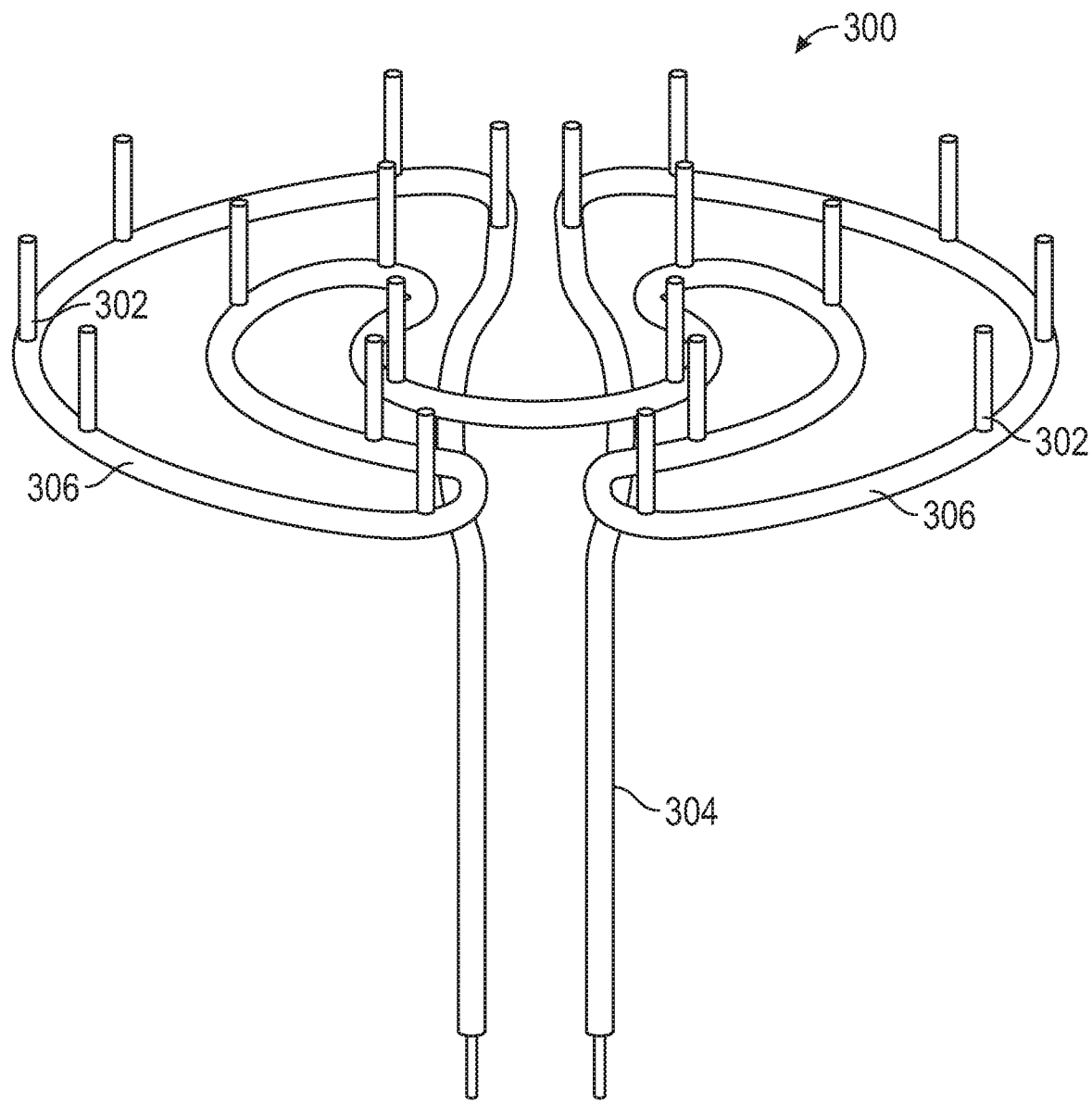
FIG. 3 is a pictorial view of a heater element, according to an example embodiment.
Figure 4:
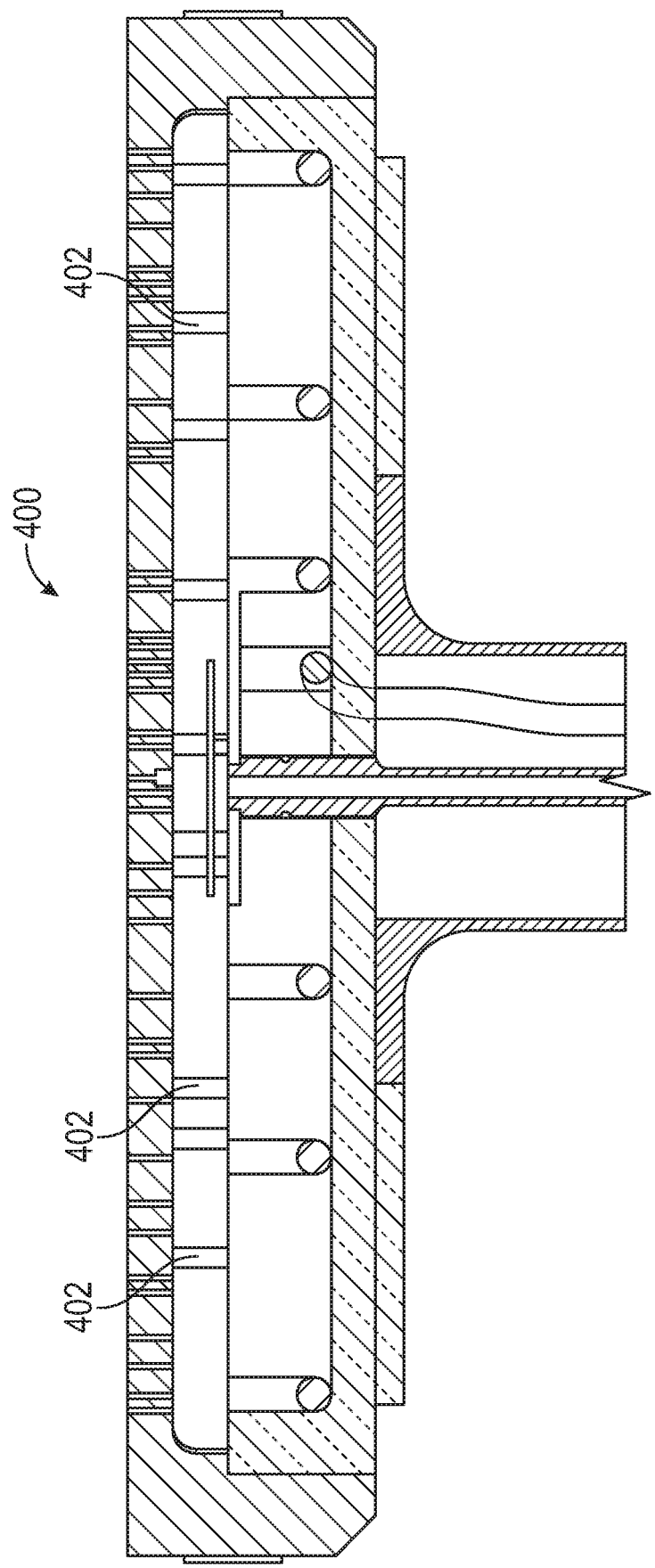
FIG. 4 is a sectional view of a showerhead pedestal, according to an example embodiment.

In some examples, thermal non-uniformity in a pedestal or a showerhead may result in poor "on wafer" (on substrate) processing performance. In this situation, processing heat is lost or not directed correctly to a desired region. Reference is made to FIGS. 3-4 which depict components of a further example of the present disclosure.

The heater element 300 illustrated in FIG. 3 has features for controlling or enhancing heat transfer within a showerhead, pedestal. The heater element 300 includes heater coils 306 supplied by one or more power lines 304. In some configurations of showerhead pedestals, heat transfer between a faceplate 102 and a platen 104 (or backplate) occurs mostly by conduction at joined edges thereof, for example in or near zone 120 of FIG. 1. In the illustrated example of FIG. 3, supplementary heat transfer columns or posts 302 are provided. The posts 302 may be separately fabricated or formed by friction stir welding to extend between the faceplate 102 and platen 104, as shown for example at 402 in FIG. 4. Other elements of the showerhead pedestal 400 may be the same as or similar to those described above in relation to showerhead pedestal assembly 100 of FIG. 1.

The posts 302 (402 in FIG. 4) manufactured by friction stir welding may assist, for example, in conducting heat between a faceplate 102 and platen 104 within a showerhead, pedestal assembly 100. In some examples, the heat transfer posts 302 may enhance a structural rigidity of the showerhead pedestal assembly 100, or a security of a location of a heater element 106 within a platen 104, or a stiffness of a faceplate 102 or platen 104. In some examples, the heat transfer posts 302 allow escape of heat from the faceplate 102 to the platen 104 or by radiation to reduce the temperature of the faceplate 102 during wafer processing and minimize or avoid faceplate deflection or warping. Other configurations and arrangements of the heat transfer posts 302 are possible. A material of the heat transfer posts 302 may be selected to enhance or retard heat transfer between a faceplate 102 and a platen 104. A selected material for a post 302 may, or may not, be the same as a material of a heater coil 108.

Figure 5:
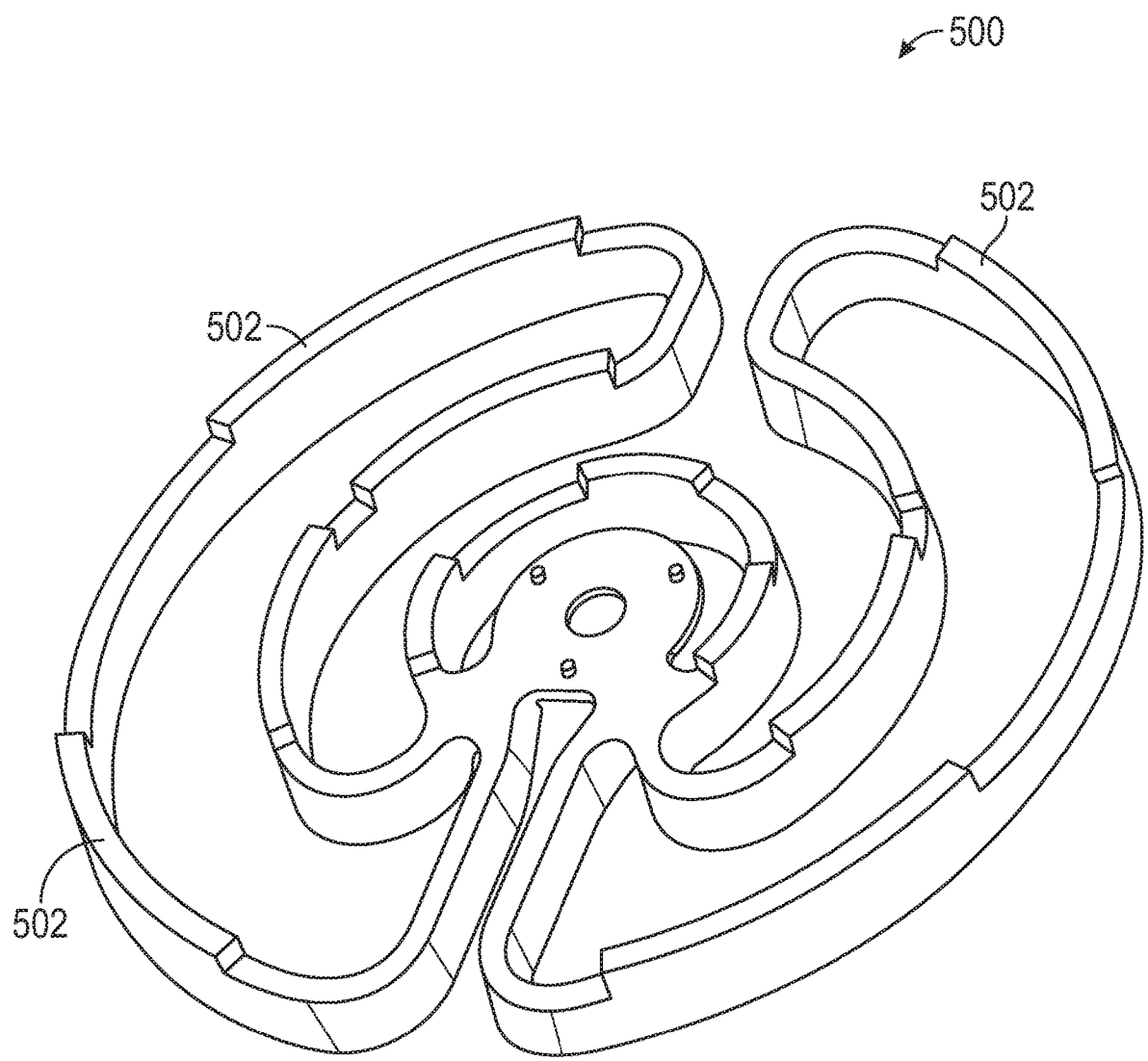
FIG. 5 is a pictorial view of a filler cap, according to an example embodiment.

FIG. 5 illustrates an example filler cap 500 that includes a series of curved or arc-shaped baffles 502 formed alone an upper surface thereof, as shown for example. Other configurations are possible. The illustrated filler cap 500 can secure the coils 108 of a heater element 106 within the channel 124 of a platen 104, as previously described with reference to FIG. 1.

Figure 6:
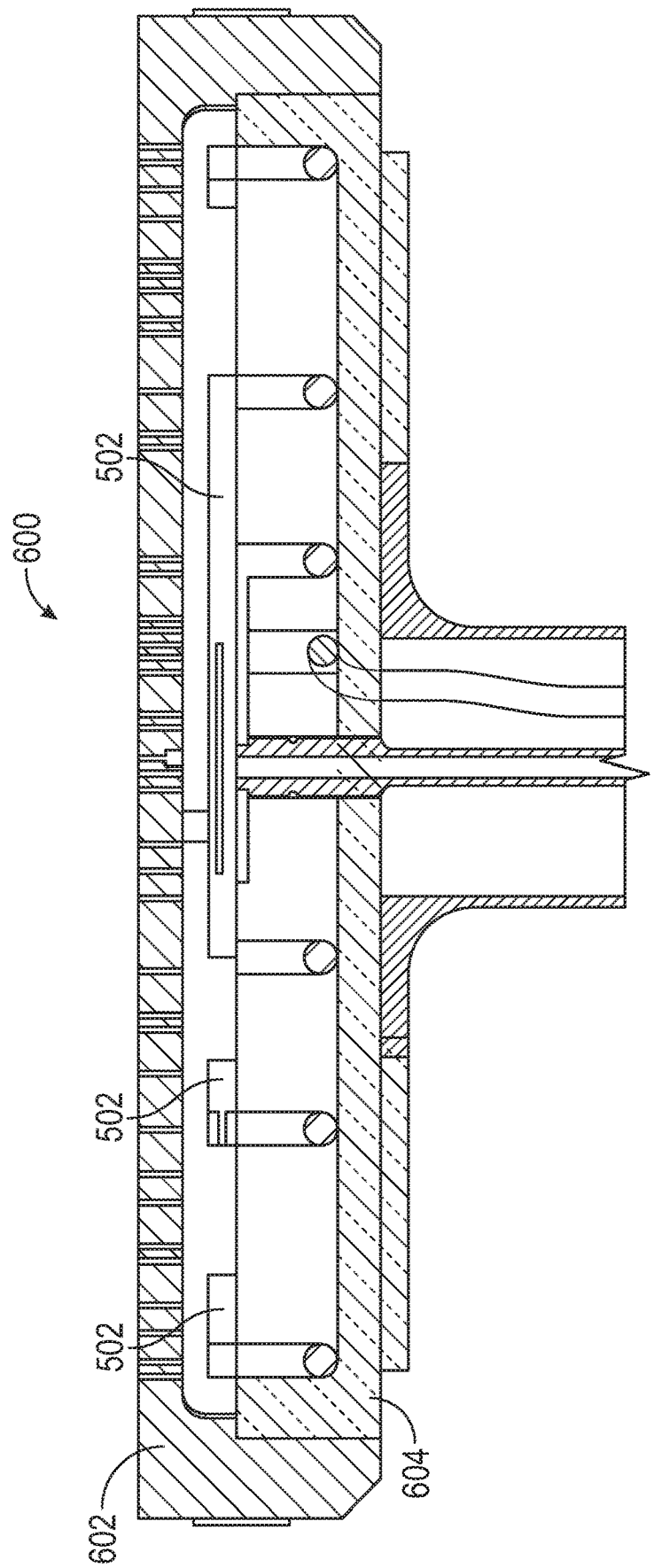
FIG. 6 is a sectional view of a showerhead pedestal, according to an example embodiment.

With reference to FIG. 6, in some examples of a showerhead pedestal 600, various combinations of friction stir welded posts 302 (for example, shown in FIG. 3, not visible in FIG. 6) and curved baffles 502 may be interposed between a platen 604 and faceplate 602 to control heat transfer and improve thermal uniformity. Other arrangements and configurations of baffles 502 are possible. By virtue of the ability of friction stir welding to weld dissimilar metals, optimized materials pairings, thicknesses and spacing patterns for a series of baffles may be employed and configured, accordingly. Other elements of the showerhead pedestal 600 may be the same as or similar to those described above in relation to showerhead pedestal assembly 100 of FIG. 1.

Figure 7:
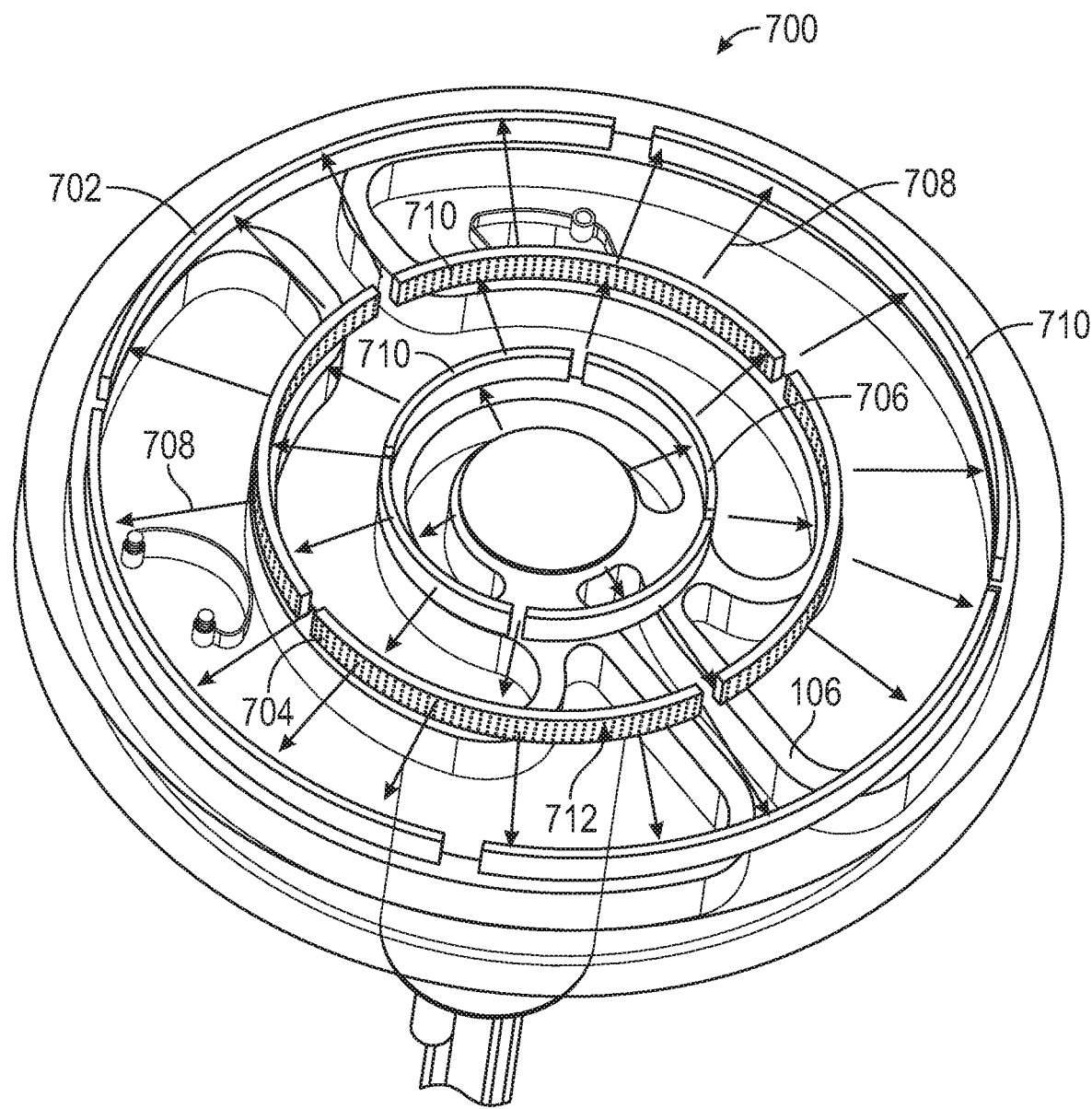
FIG. 7 is a pictorial, part sectional view of a showerhead pedestal, according to an example embodiment.
Figure 8:
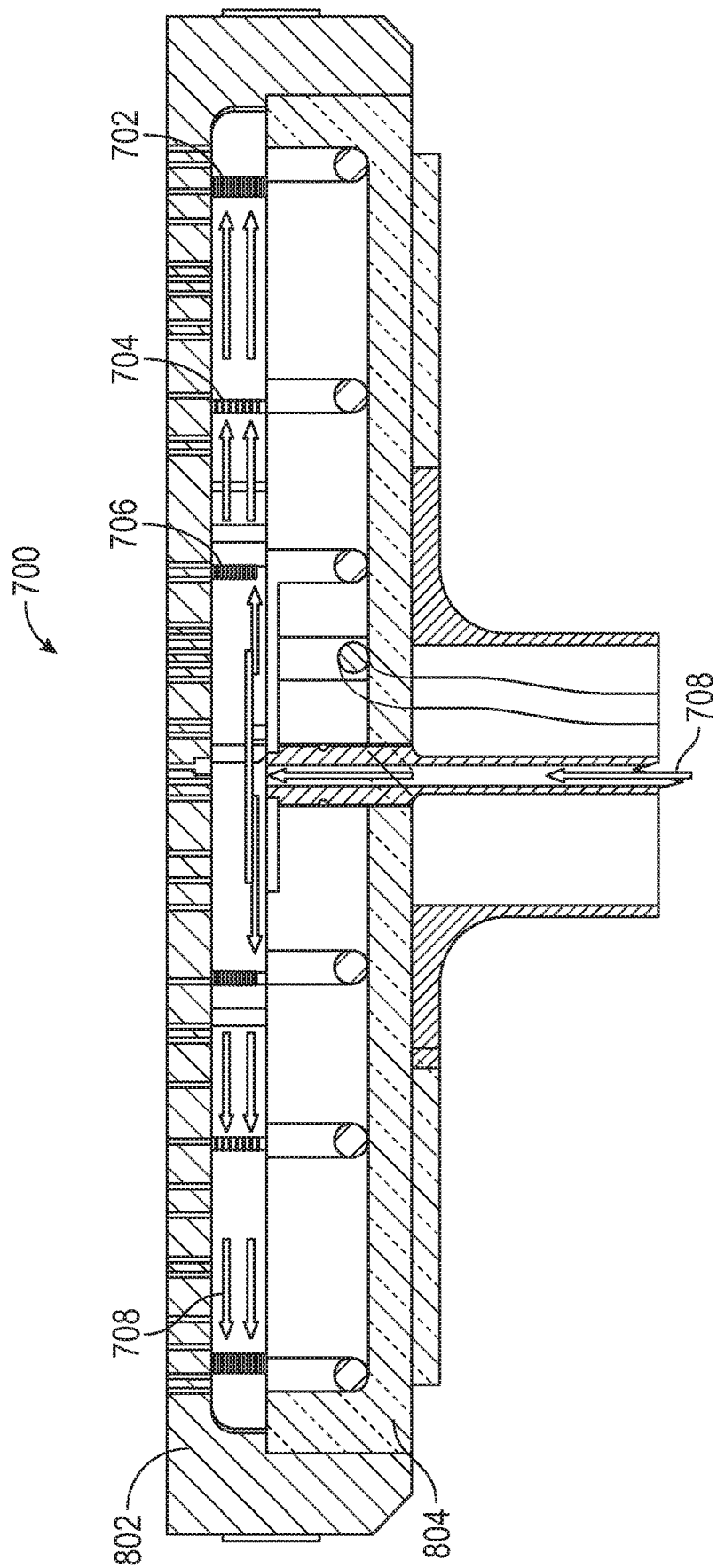
FIG. 8 is a sectional view of a showerhead pedestal, according to an example embodiment.

With reference to FIGS. 7-8, some example embodiments may provide more specific control of thermal and gas flows 708 within a showerhead pedestal 700. In some examples, concentric rings 702, 704, and 706 of spaced baffles 710 are provided to extend between a faceplate 802 and platen 804 (FIG. 8) within a showerhead pedestal 700 (or 100, 400, 600). In some examples, the baffles 710 include apertures 712 and be spaced apart as shown (or in other manners) to allow a specific or controlled flow of gas through the apertures 712 or past the baffles 710 in the spaced gaps therebetween.

Figure 10:
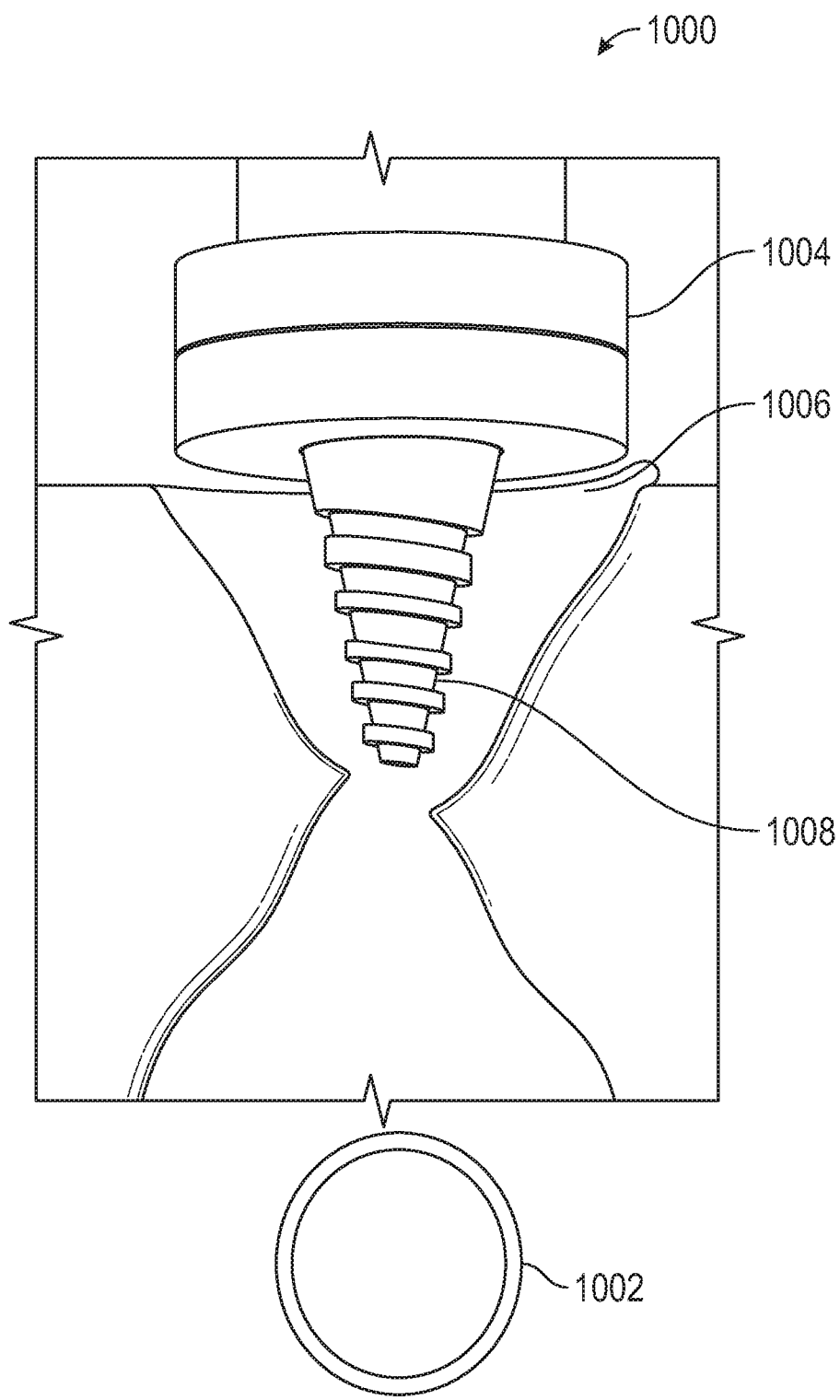
FIG. 10 shows aspects of an arrangement for friction stir welding, according to an example embodiment.

FIG. 10 shows aspects of an example arrangement 1000 for friction stir welding. In some examples, a heater coil 1002 (for example, one of the heater coils 108, FIG. 1) is activated during the friction stir welding by an FSW tool 1004 of pedestal components to control cooling behaviour and grain growth or size around an FSW weld. The FSW tool 1004 may include a shoulder 1006 and a pin 1008 as described previously. Conventionally, FSW joints are left to cool by natural convection and no process control for the weld zone typically exists in the current context. In some examples of the present disclosure, the activation of heater coils 1002 during an FSW process may control (for example, retard) a cooling rate of an FSW weld to configure or provide specific heat affected zones and improve weld quality and material properties by controlling grain growth during weld solidification, for example.

Figure 11:
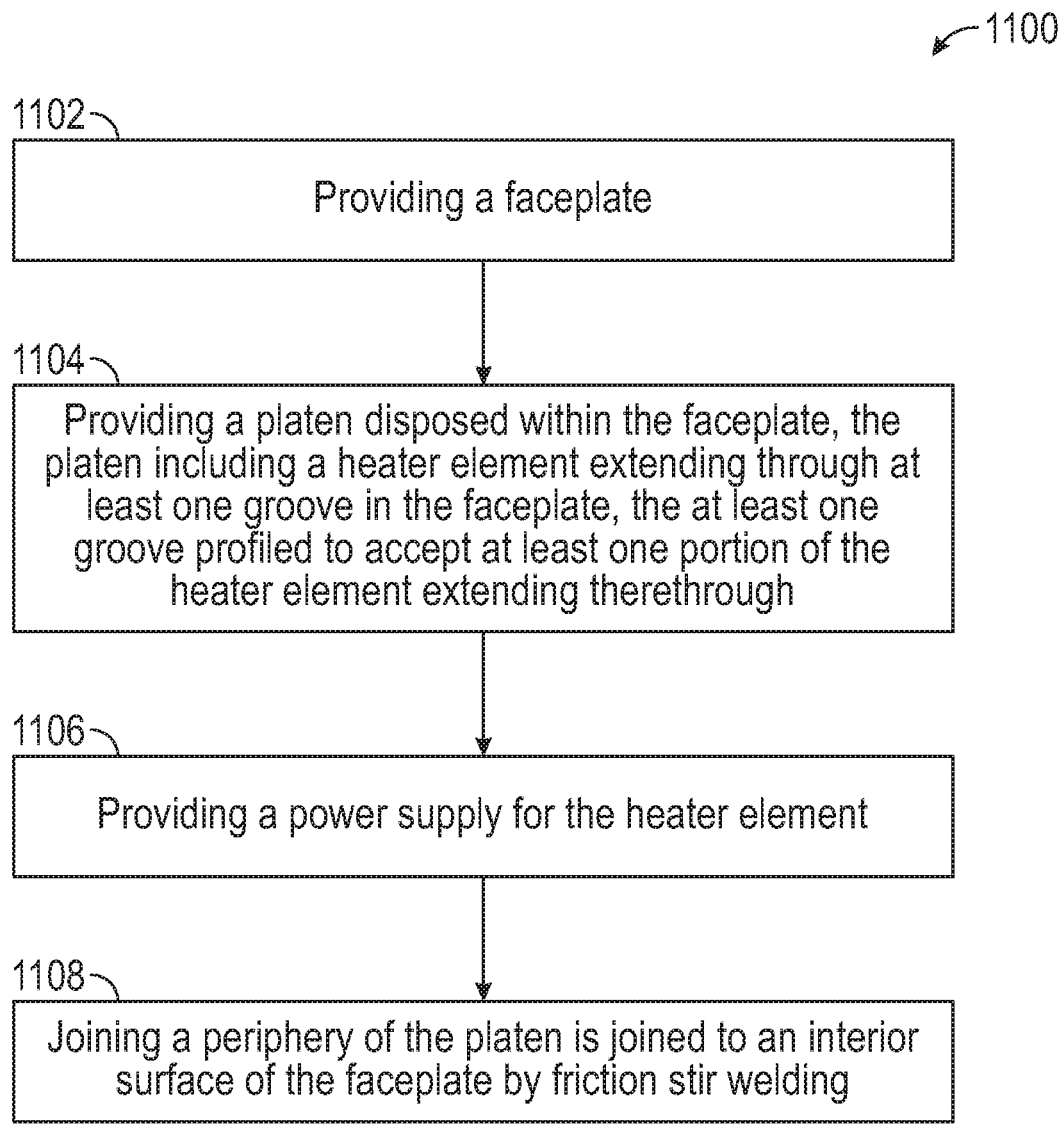
FIG. 11 is a flowchart including operations in an example method, according to an example embodiment.

The present disclosure includes method embodiments. With reference to FIG. 11, an example method 1100 of forming a showerhead pedestal assembly for a substrate processing chamber comprises: at operation 1102, providing a faceplate; at operation 1104, providing a platen disposed within the faceplate, the platen including a heater element extending through at least one groove in the faceplate, the at least one groove profiled to accept at least one portion of the heater element extending therethrough; at operation 1106, providing a power supply for the heater element; and, at operation 1108, joining a periphery of the platen to an interior surface of the faceplate by friction stir welding.

In some examples, the method 1100 further comprises forming in the faceplate a plurality of apertures to allow the passage of a gas through the showerhead pedestal assembly to an underside of a substrate supported by the showerhead pedestal assembly.

In some examples, the method 1100 further comprises forming, by friction stir welding, a plurality of heat transfer posts extending between opposed surfaces of the faceplate and the platen.

In some examples, the friction stir welding includes a material dissimilar to a material of the faceplate or the platen and enables the creation of a friction stir welded joint between the faceplate and the platen.

In some examples, the method 1100 further comprises selecting a material of the plurality of heat transfer posts to enhance or retard a heat transfer between the faceplate and the platen.

In some examples, a material of the plurality of heat transfer posts is the same as a material of the heater coil.

In some examples, the method 1100 further comprises providing a filler cap for the showerhead pedestal assembly, the filler cap including at least one baffle sized and configured to reside in the at least one groove in the faceplate.

In some examples, the at least one baffle of the filler cap secures the at least one portion of the heater coil in a respective groove in the faceplate.

In some examples, the at least one baffle includes a curved formation, the curved formation matching a profile of the respective groove in the faceplate.

In some examples, the method 1100 further comprises forming the at least one baffle by friction stir welding.

In some examples, the method 1100 further comprises providing the at least one baffle along an upper surface of the filler cap.

In some examples, a portion of the filler cap includes a heat sink, the heat sink providing a body of relatively cooler material than a material of the platen during operation of the showerhead pedestal assembly.

In some examples, the at least one baffle includes at least one aperture allowing the passage of gas therethrough.

In some examples, the at least one baffle is provided in a series of baffles extending in a spaced array along a profile of the heater element, the spaced array of baffles including one or more gaps between sequential baffles allowing the passage of gas therethrough.

In some examples, a material included in the friction stir welding of the at least one baffle is dissimilar to a material of the faceplate or the heater element and enables the creation of a friction stir welded joint between the heater element and the faceplate.

In some examples, the at least one baffle is included in a plurality of concentric rings of baffles.

In some examples, the at least one ring of the plurality of concentric rings of baffles includes spaced baffles.

In some examples, each of the spaced baffles includes one or more apertures form therein allowing a specific or controlled flow of gas through the one or more apertures.

In some examples, a cap between a pair of spaced baffles in the at least one concentric ring of baffles is sized to allow a specific or controlled flow of gas to pass therethrough.

In some examples, the method 1100 further comprises energizing the heater element by the power supply during formation of a friction stir welded joint by the friction stir welding.

Figure 9:
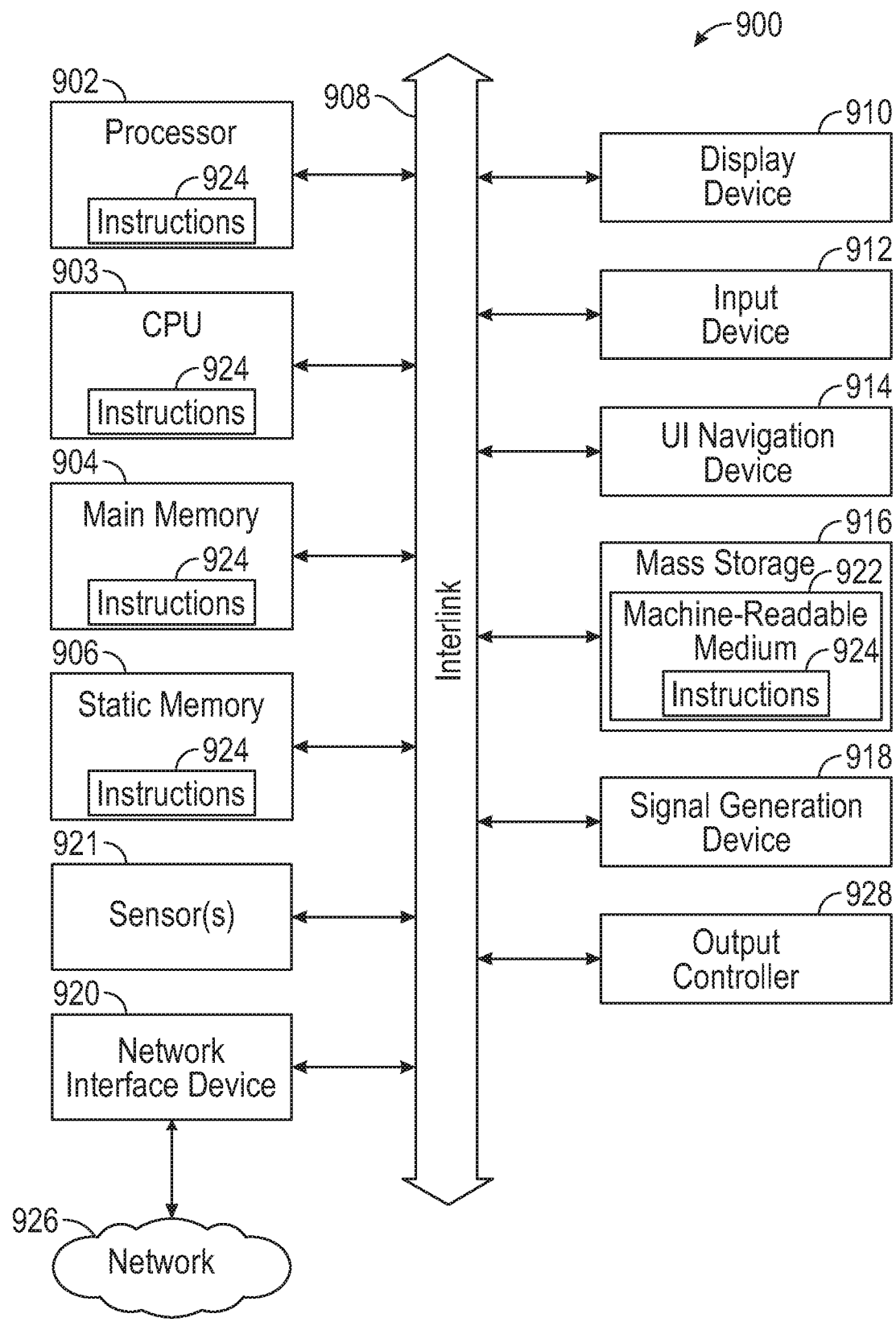
FIG. 9 is a block diagram illustrating an example of a machine by which one or more example embodiments may be controlled.

FIG. 9 is a block diagram illustrating an example of a machine 900 upon which one or more example process embodiments described herein may be implemented, or by which one or more example process embodiments described herein may be controlled. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in a peer-to-peer (P2P) (or other distributed) network environment. Further, while only a single machine 900 is illustrated, the term "machine" shall also be taken to include any collection of machines that individually or jointly execute a set (or multiple sets) of instructions 924 to perform any one or more of the methodologies discussed herein, such as via cloud computing, software as a service (SaaS), or other computer cluster configurations.

Examples, as described herein, may include, or may operate by, logic and/or a number of components or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions 924 of the specific operation. In connecting the physical components, the underlying electrical properties of a hardware constituent are changed (for example, from an insulator to a conductor or vice versa). The instructions 924 enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 900 may include a hardware processor 902 (e.g., a central processing unit (CPU), a hardware processor core, or any combination thereof), a graphics processing unit (GPU) 903, a main memory 904, and a static memory 906, some or all of which may communicate with each other via an interlink (e.g., bus) 908. The machine 900 may further include a display device 910, an alphanumeric input device 912 (e.g., a keyboard), and a user interface (UI) navigation device 914 (e.g., a mouse). In an example, the display device 910, alphanumeric input device 912, and UI navigation device 914 may be a touch screen display. The machine 900 may additionally include a mass storage device (e.g., drive unit) 916, a signal generation device 918 (e.g., a speaker), a network interface device 920, and one or more sensors 921, such as a Global Positioning System (GPS) sensor, compass, accelerometer, or another sensor. The machine 900 may include an output controller 928, such as a serial (e.g., universal serial bus (USB)), parallel, or other wired or wireless (e.g., infrared (IR), near field communication (NFC), etc.) connection to communicate with or control one or more peripheral devices a printer, card reader, etc.).

The mass storage device 916 may include a machine-readable medium 922 on which is stored one or more sets of data structures or instructions 924 (e.g., software) embodying or utilized by any one or more of the techniques or functions described herein. The instructions 924 may also reside, completely or at least partially, within the main memory 904, within the static memory 906, within the hardware processor 902, or within the GPU 903 during execution thereof by the machine 900. In an example, one or any combination of the hardware processor 902, the GPU 903, the main memory 904, the static memory 906, or the mass storage device 916 may constitute machine-readable media 927.

While the machine-readable medium 922 is illustrated as a single medium, the term "machine-readable medium" may include a single medium, or multiple media (e.g., a centralized or distributed database, and/or associated caches and servers) configured to store the one or more instructions 924.

The term "machine-readable medium" may include any medium that can store, encode, or carry instructions 924 for execution by the machine 900 and that cause the machine 900 to perform any one or more of the techniques of the present disclosure, or that can store, encode, or carry data structures used by or associated with such instructions 924. Non-limiting machine-readable medium examples may include solid-state memories, and optical and magnetic media. In an example, a massed machine-readable medium comprises a machine-readable medium 922 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 924 may further be transmitted or received over a communications network 926 using a transmission medium via the network interface device 920.

Although an embodiment has been described with reference to specific example embodiments, it will be evident that various modifications and changes may be made to these embodiments without departing from the broader scope of the disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover all adaptations or variations of various embodiments. Combinations of the above embodiments, and other embodiments not specifically described herein, will be apparent to those of skill in the art upon reviewing the above description.

The invention claimed is:

1. A showerhead pedestal assembly for a substrate processing chamber, the showerhead pedestal assembly including:
   a faceplate; and
   a platen connected with the faceplate, the platen including at least one groove, a heater element disposed at least partially within the at least one groove, and a filler cap also at least partially disposed within the at least one groove so as to secure the heater element within the at least one groove, wherein the at least one groove is profiled to accept at least one portion of the heater element and the
   filler cap is secured to the platen by a friction stir welded joint, and wherein the filler cap includes at least one baffle that protrudes from the platen.

2. The showerhead pedestal assembly of claim 1, wherein the faceplate includes a plurality of apertures distributed across a surface of the faceplate facing away from the platen and configured to allow the flow of a gas through the showerhead pedestal assembly and away from the surface of the faceplate facing away from the platen.

3. The showerhead pedestal assembly of claim 1, wherein:
   the heater element follows a curvilinear path that is distributed across the platen, and
   at least a portion of the filler cap follows the curvilinear path.

4. The showerhead pedestal assembly of claim 3, wherein the curvilinear path is a serpentine path.

5. The showerhead pedestal assembly of claim 3, wherein the heater element includes at least a first segment that follows a first arcuate path, a second segment that follows a second arcuate path, and a third segment that follows a third arcuate path, wherein the first arcuate path, the second arcuate path, and the third arcuate path are concentric with one another and each have a different radius.

6. The showerhead pedestal assembly of claim 5, wherein the heater element further includes a fourth segment that follows a fourth arcuate path and a fifth segment that follows a fifth arcuate path, the fourth arcuate path and the fifth arcuate path are concentric with one another, the fourth arcuate path and the second arcuate path have the same radius, and the fifth arcuate path and the third arcuate path have the same radius.

7. The showerhead pedestal assembly of claim 1, wherein the at least one baffle includes a curved formation, the curved formation matching a profile of a respective portion of the at least one groove in the platen.

8. The showerhead pedestal assembly of claim 1, wherein the at least one baffle includes a friction stir welded material.

9. The showerhead pedestal assembly of claim 8, wherein the friction stir welded material of the at least one baffle is dissimilar to a material of the faceplate or the heater element and enables the creation of a friction stir welded joint between the heater element and the faceplate.

10. The showerhead pedestal assembly of claim 1, wherein the at least one baffle is provided along an upper surface of the filler cap.

11. The showerhead pedestal assembly of claim 1, wherein the at least one baffle includes at least one aperture allowing the passage of gas therethrough.

12. The showerhead pedestal assembly of claim 1, wherein the at least one baffle is provided in a series of baffles extending in a spaced array along a path followed by the heater element, the spaced array of baffles including one or more gaps between sequential baffles allowing the passage of gas therethrough.

13. The showerhead pedestal assembly of claim 1, wherein the at least one baffle includes a plurality of concentric rings of baffles.

14. The showerhead pedestal assembly of claim 13, wherein at least one ring of the plurality of concentric rings of baffles includes spaced-apart baffles.

15. The showerhead pedestal assembly of claim 14, wherein each of the spaced-apart baffles includes one or more apertures formed therein allowing a specific or controlled flow of gas through the one or more apertures.

16. The showerhead pedestal assembly of claim 14, wherein a gap between a pair of the spaced-apart baffles in the at least one ring of baffles is sized to allow a specific or controlled flow of gas to pass therethrough.

17. The showerhead pedestal assembly of claim 1, further comprising a power supply connected with the heater element, wherein the heater element is energized by the power supply during formation of the friction stir welded joint.

18. A method of forming a showerhead pedestal assembly for a substrate processing chamber, the method comprising:

providing a faceplate;

connecting a platen with the faceplate, the platen including a heater element extending through at least one groove in the platen, the at least one groove profiled to accept at least one portion of the heater element extending therethrough;

installing a filler cap into the at least one groove to secure the heater element in the at least one groove;

forming a friction stir welded joint between the filler cap and the platen; and forming at least one baffle protruding from the platen on the filler cap.

19. The method of claim 18, further comprising forming in the faceplate a plurality of apertures to allow the passage of a gas through the showerhead pedestal assembly to an underside of a substrate supported by the showerhead pedestal assembly.

20. The method of claim 18, wherein:

the heater element follows a curvilinear path that is distributed across the platen, and at least a portion of the filler cap follows the curvilinear path.

21. The method of claim 20, wherein the curvilinear path is a serpentine path.

22. The method of claim 20, wherein the heater element includes at least a first segment that follows a first arcuate path, a second segment that follows a second arcuate path, and a third segment that follows a third arcuate path, wherein the first arcuate path, the second arcuate path, and the third arcuate path are concentric with one another and each have a different radius.

23. The method of claim 20, wherein the heater element further includes a fourth segment that follows a fourth arcuate path and a fifth segment that follows a fifth arcuate path, the fourth arcuate path and the fifth arcuate path are concentric with one another, the fourth arcuate path and the second arcuate path have the same radius, and the fifth arcuate path and the third arcuate path have the same radius.

24. The method of claim 18, wherein the at least one baffle includes a curved formation, the curved formation matching a profile of a respective portion of the at least one groove in the platen.

25. The method of claim 18, further comprising forming the at least one baffle by friction stir welding.

26. The method of claim 25, wherein a material included in the friction stir welding of the at least one baffle is dissimilar to a material of the faceplate or the heater element and enables the creation of a friction stir welded joint between the heater element and the faceplate.

27. The method of claim 18, further comprising providing the at least one baffle along an upper surface of the filler cap.

28. The method of claim 18, wherein the at least one baffle includes at least one aperture allowing the passage of gas therethrough.

29. The method of claim 18, wherein the at least one baffle is provided in a series of baffles extending in a spaced array along a path followed by the heater element, the spaced array of baffles including one or more gaps between sequential baffles allowing the passage of gas therethrough.

30. The method of claim 18, wherein the at least one baffle include a plurality of concentric rings of baffles.

31. The method of claim 30, wherein at least one ring of the plurality of concentric rings of baffles includes spaced-apart baffles.

32. The method of claim 31, wherein each of the spaced-apart baffles includes one or more apertures formed therein allowing a specific or controlled flow of gas through the one or more apertures.

33. The method of claim 31, wherein a gap between a pair of the spaced-apart baffles in the at least one ring of baffles is sized to allow a specific or controlled flow of gas to pass therethrough.

34. The method of claim 18, further comprising providing a power supply for the heater element and energizing the heater element by the power supply during formation of the friction stir welded joint.

* * * * *